US010777442B2

(12) United States Patent
Thirunavukarasu et al.

(10) Patent No.: US 10,777,442 B2
(45) Date of Patent: Sep. 15, 2020

(54) HYBRID SUBSTRATE CARRIER

(71) Applicant: APPLIED MATERIALS, INC., Santa Clara, CA (US)

(72) Inventors: Sriskantharajah Thirunavukarasu, Singapore (SG); Shoju Vayyapron, Bangalore (IN); Anand Mahadev, Bangalore (IN); Shankeerthan Kalyanasundaram, Colombo (LK); Eng Sheng Peh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 334 days.

(21) Appl. No.: 15/815,673

(22) Filed: Nov. 16, 2017

(65) Prior Publication Data

US 2018/0144969 A1 May 24, 2018

Related U.S. Application Data

(60) Provisional application No. 62/424,159, filed on Nov. 18, 2016.

(51) Int. Cl.

| | |
|---|---|
| ***H01L 21/3065*** | (2006.01) |
| ***H01L 21/683*** | (2006.01) |
| ***H01L 21/687*** | (2006.01) |
| ***H01L 21/673*** | (2006.01) |
| *H01L 21/00* | (2006.01) |
| *H01L 21/311* | (2006.01) |
| *H02N 13/00* | (2006.01) |

(52) U.S. Cl.
CPC .... *H01L 21/6831* (2013.01); *H01L 21/67333* (2013.01); *H01L 21/67336* (2013.01); *H01L 21/683* (2013.01); *H01L 21/68735* (2013.01); *H01L 21/00* (2013.01); *H01L 21/3065* (2013.01); *H01L 21/31116* (2013.01); *H01L 21/6836* (2013.01); *H02N 13/00* (2013.01)

(58) Field of Classification Search
USPC .......................................................... 361/234
See application file for complete search history.

(56) References Cited

U.S. PATENT DOCUMENTS

2006/0164786 A1* 7/2006 Kobayashi ............. H02N 13/00 361/234
2008/0062609 A1* 3/2008 Himori ............... H01L 21/6833 361/234
2008/0220622 A1* 9/2008 Goodman ......... H01L 21/67103 438/800
2011/0061810 A1* 3/2011 Ganguly ........... H01L 21/67115 156/345.27
2015/0332951 A1* 11/2015 Male ..................... C23C 16/458 361/234
2016/0126129 A1* 5/2016 Barker .............. H01L 21/68721 438/710
2017/0178922 A1* 6/2017 Takashima ........ H01J 37/32009

* cited by examiner

*Primary Examiner* — Danny Nguyen
(74) *Attorney, Agent, or Firm* — Moser Taboada

(57) ABSTRACT

Embodiments of a hybrid substrate carrier are provided herein. In some embodiments, a substrate carrier includes: a carrier ring having an inner ledge adjacent a central opening of the carrier ring; and a carrier plate having a diameter greater than central opening and configured to rest upon the inner ledge, wherein the carrier plate includes an electrode disposed beneath a support surface to electrostatically clamp a substrate to the support surface of the carrier plate.

19 Claims, 5 Drawing Sheets

100
110
106
108
104
112
102

HYBRID SUBSTRATE CARRIER

CROSS-REFERENCE TO RELATED APPLICATIONS

This application claims benefit of U.S. provisional patent application Ser. No. 62/424,159, filed Nov. 18, 2016, which is herein incorporated by reference in its entirety.

FIELD

Embodiments of the present disclosure generally relate to semiconductor substrate processing systems.

BACKGROUND

Integrated circuit production has been migrating from 200 mm to 300 mm substrates, or wafers, for several years. The move allows the creation of up to 2.5 times more chips on a single wafer and can enable chipmakers to lower the cost of producing the increasingly powerful semiconductors demanded by today's Information Age applications. However, the inventors believe that not all semiconductors will ever be produced on 300 mm wafers. Although chip capacity is transitioning to 300 mm wafers, the inventors believe that 200 mm wafers will not disappear in the near future. Specifically, the inventors believe that fabs running 200 mm wafers may continue to be used at least for the indefinite future to fabricate a variety of devices, for example, specialty memories, image sensors, display drivers, microcontrollers, analog products, and MEMS-based devices. The inventors further believe that some chipmakers may desire to have a mix of chip production running 300 mm and 200 mm wafers on 300 mm and 200 mm tools respectively.

Thus, the inventors have provided embodiments of substrate carriers for multiple-sized substrates for use in substrate processing systems.

SUMMARY

Embodiments of a hybrid substrate carrier are provided herein. In some embodiments, a substrate carrier includes: a carrier ring having an inner ledge adjacent a central opening of the carrier ring; and a carrier plate having a diameter greater than central opening and configured to rest upon the inner ledge, wherein the carrier plate includes an electrode disposed beneath a support surface to electrostatically clamp a substrate to the support surface of the carrier plate.

In some embodiments, a substrate carrier includes: a carrier ring having an inner ledge adjacent a central opening of the carrier ring, an outer ledge, and a substantially planar upper surface disposed between the inner and outer ledges; and a carrier plate having a diameter greater than central opening and configured to rest upon the inner ledge, wherein the carrier plate includes an electrode to electrostatically clamp a substrate to the carrier plate; wherein a lower surface of the carrier plate and a lower surface of the carrier ring are substantially coplanar when the carrier plate is disposed on the inner ledge; and wherein the carrier plate has a thickness less than a thickness of the carrier ring. In some embodiments, the carrier plate has a diameter less than 200 mm, and a sidewall of the carrier ring at the interface of the upper surface and the inner ledge is disposed along a diameter that is greater than 200 mm to define a gap between the edge of a 200 mm wafer (when disposed on the carrier plate) and the sidewall.

In some embodiments, a substrate carrier includes: a carrier ring having an inner ledge adjacent a central opening of the carrier ring, an outer ledge, a substantially planar upper surface disposed between the inner and outer ledges, and a substantially planar lower surface opposite the upper surface, wherein the inner ledge is stepped and has an inner portion having a lesser thickness than an outer portion of the inner ledge; and a carrier plate having a diameter greater than central opening and configured to rest upon the inner ledge, wherein the carrier plate includes a lower portion having a diameter less than the central opening and radially extending protrusion configured to rest on the inner portion of the inner ledge of the carrier ring such that the lower portion sits within the central opening, and wherein the carrier plate includes an electrode to electrostatically clamp a substrate to the carrier plate; wherein a lower surface of the carrier plate and a lower surface of the carrier ring are substantially coplanar when the carrier plate is disposed on the inner ledge; and wherein the carrier plate has a thickness less than a thickness of the carrier ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
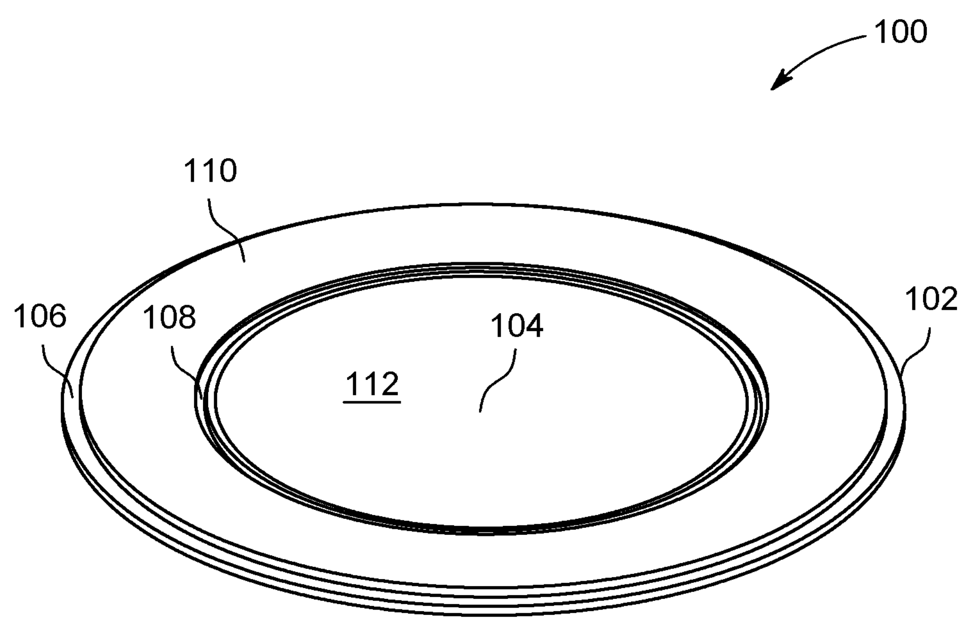
FIG. 1 is a isometric view of a hybrid substrate carrier in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a hybrid substrate carrier are provided herein. Embodiments of the present disclosure advantageously enable 200 mm wafers to be run with little or no hardware modifications while maintaining process transparency and stable defect performance on 300 mm platforms and process chambers. In addition, embodiments of the present disclosure advantageously allow flexibility to increase the capacity of 200 mm wafer production on existing available 300 mm tools and switching back to 300 mm wafer production effortlessly. Moreover, the hybrid substrate carrier is reusable and designed to prevent wafer level arcing.

Embodiments of the hybrid bridge carrier are designed to chuck 200 mm electrostatically and transit seamlessly across processing chambers in 300 mm platforms. Thus, no downtime is incurred to switch production from 300 mm to 200 mm wafers. Embodiments of the hybrid bridge carrier are process transparent and compatible to most 300 mm multi-chamber systems in microelectronic device production. Moreover, embodiments of the present disclosure advantageously provide significant cost savings and minimum production scheduled downtime for substrate handler conversion in enabling 200 mm wafer production on 300 mm platforms and process chambers. For example, embodiments of the hybrid bridge carrier are compatible with 300 mm multi-chamber systems, such as physical vapor deposition (PVD) chambers, chemical vapor deposition (CVD) chambers, etching chambers, and the like.

Figure 2:
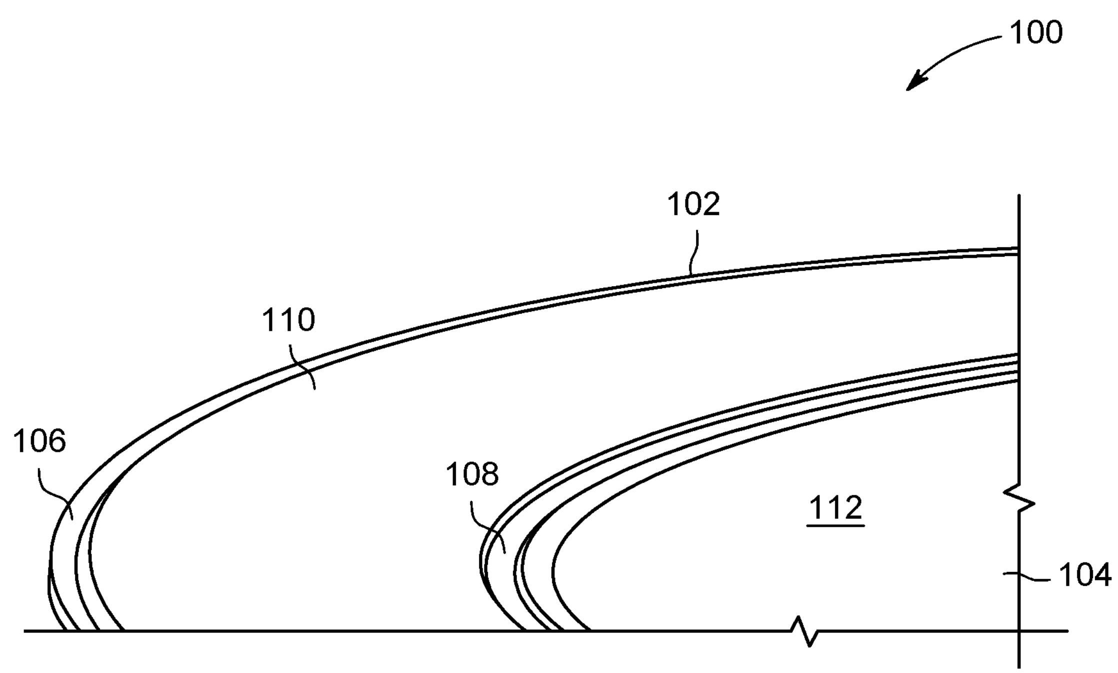
FIG. 2 is a partial isometric view of the hybrid substrate carrier of FIG. 1 in accordance with at least some embodiments of the present disclosure.
Figure 3:
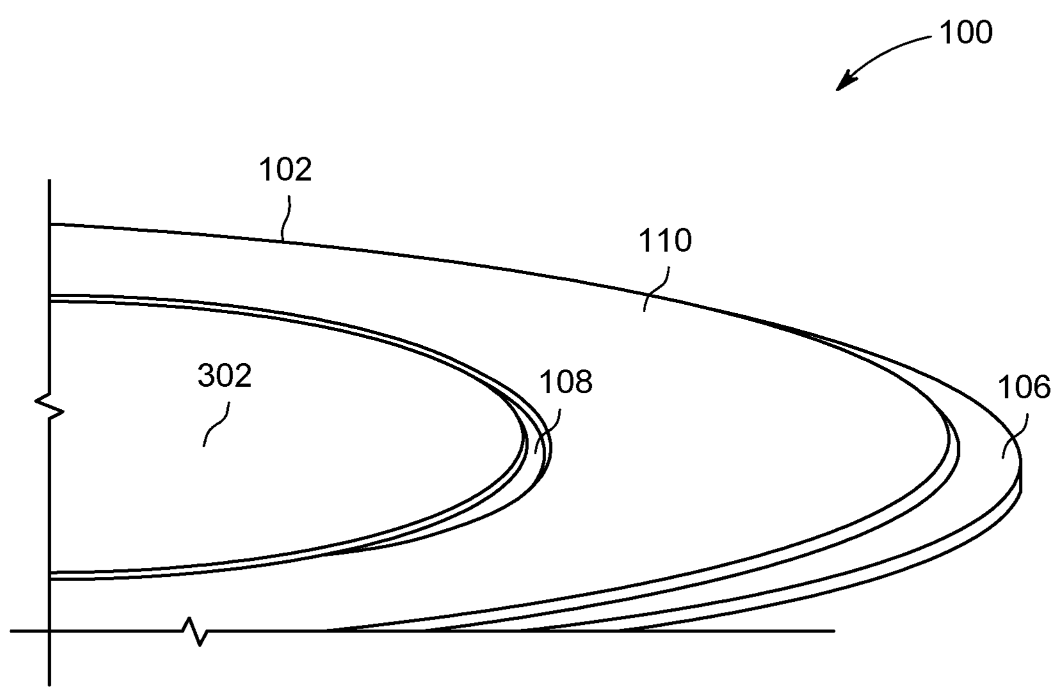
FIG. 3 is a partial isometric view of the hybrid substrate carrier of FIG. 1 in accordance with at least some embodiments of the present disclosure and having a substrate disposed thereon.

FIG. 1 is a isometric view of a hybrid substrate carrier in accordance with at least some embodiments of the present disclosure. FIG. 2 is a partial isometric view of the hybrid substrate carrier of FIG. 1 enlarged to more clearly illustrate the hybrid substrate carrier. FIG. 3 is a partial isometric view of the hybrid substrate carrier of FIG. 1 having a substrate disposed thereon. As shown in FIGS. 1-3, a hybrid substrate carrier (e.g., substrate carrier 100) includes a carrier ring 102 and a carrier plate 104 configured to rest within the carrier ring 102.

In some embodiments, the carrier ring 102 includes an outer ledge 106 disposed along the outer peripheral edge of the carrier ring 102. The outer ledge 106 may advantageously facilitate handling (e.g., storage and/or movement) of the carrier ring 102 (and the substrate carrier 100 as a whole). Thus, the outer ledge is configured for handling by substrate handling equipment (such as 300 mm substrate handling equipment). In some embodiments, the outer ledge 106 is free or substantially free of openings formed therethrough. The carrier ring 102 includes an inner ledge 108 disposed along the inner peripheral edge of the carrier ring 102. In some embodiments, the inner ledge 108 is free or substantially free of openings formed therethrough. An upper surface 110 of the carrier ring 102 disposed between the outer ledge 106 and the inner ledge 108 is raised above the respective upper surfaces of the outer ledge 106 and the inner ledge 108. In some embodiments, the upper surface 110 is substantially planar. In some embodiments, the body of the carrier ring 102 is free or substantially free of openings formed therethrough. The carrier ring may be fabricated from quartz. The separable carrier ring 102 advantageously may be easily cleaned separate from the carrier plate 104.

Figure 5:
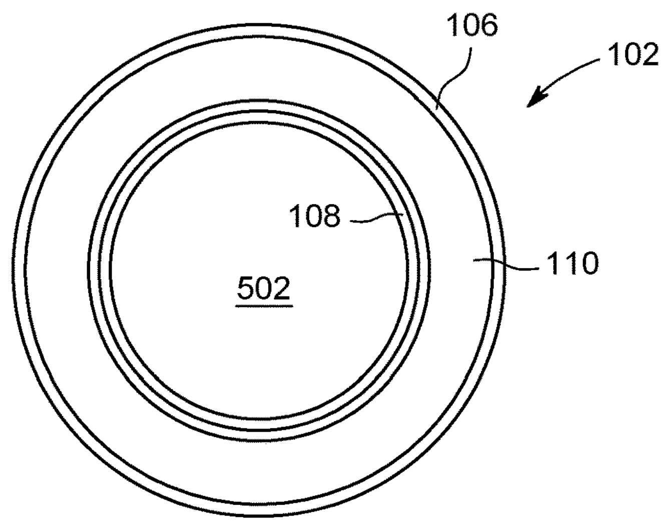
FIG. 5 is a top view of a carrier ring in accordance with at least some embodiments of the present disclosure.

FIG. 5 is a top view of a carrier ring in accordance with at least some embodiments of the present disclosure. FIG. 5 depicts a top view of the carrier ring 102 showing the outer ledge 106, upper surface 110, and inner ledge 108 surrounding a central opening 502 of the carrier ring 102. As depicted in FIG. 5, the carrier ring 102 can be free of holes or openings formed through the body of the carrier ring 102.

Returning to FIGS. 1-3, the carrier plate 104 is sized and configured such that the outer peripheral edge of the carrier plate 104 rests upon at least a portion of the inner ledge 108 of the carrier plate 104 to fill and/or cover the central opening of the carrier ring 102 (e.g., 502 in FIG. 5). The carrier plate 104 need not be mechanically coupled to the carrier ring 102. Thus, in some embodiments, no bolts, clamps, screws, adhesives, brazing, welding, or the like is provided to couple the carrier plate 104 to the carrier ring 102. The carrier plate 104 includes a substantially planar substrate support surface 112 to support a substrate thereon. For example, FIG. 3 depicts a substrate 302 disposed atop the carrier plate 104. The substrate carrier 100 may advantageously be configured to support a smaller substrate (such as a 200 mm wafer) atop the carrier plate 104 and radially inward of the upper surface 110 of the carrier ring 102.

The carrier plate 104 may be made of a highly thermally conductive material (e.g., aluminum nitride, AlN, or silicon carbide, SiC) to maintain robust thermal conductivity from an underlying substrate support through the carrier plate 104 to a substrate disposed thereon. The highly thermally conductive material (e.g., aluminum nitride, AlN, or silicon carbide, SiC) further advantageously can withstand high temperature applications in most wafer processing chambers.

Figure 4:
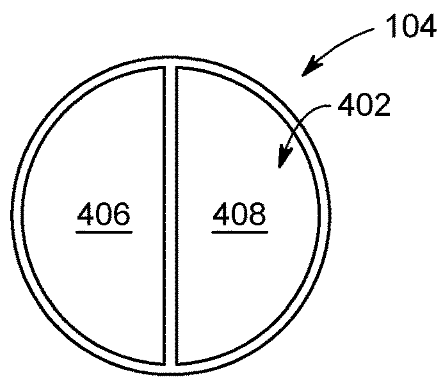
FIG. 4 is a top view of a carrier plate for a substrate carrier in accordance with at least some embodiments of the present disclosure.

The carrier plate further has electrostatic chucking capability for excellent wafer bonding and heat transmission from/to an underlying substrate support. For example, the carrier plate 104 includes an electrode, such as an embedded electrode, suitable for electrostatically clamping a substrate to the carrier plate 104. As depicted in the top view of a carrier plate as shown in FIG. 4, the carrier plate 104 may include an electrode 402. In some embodiments, and as illustrated, the electrode 402 may comprise a first electrode 406 and a second electrode 408. For example, the first and second electrodes 406, 408 may be half-moon, or semi-circular, electrodes. Other electrode configurations are suitable as well.

The electrostatic chucking capability advantageously provides excellent substrate bonding to the carrier plate 104 and enhances heat transfer between a substrate mounted on the carrier plate 104 and a substrate support upon which the substrate carrier is disposed. The electrode 402 (or first and second electrodes 406, 408) may be charged or discharged to respectively clamp or release a substrate from the carrier plate 104 at a charging/discharging station (not shown).

Figure 6:
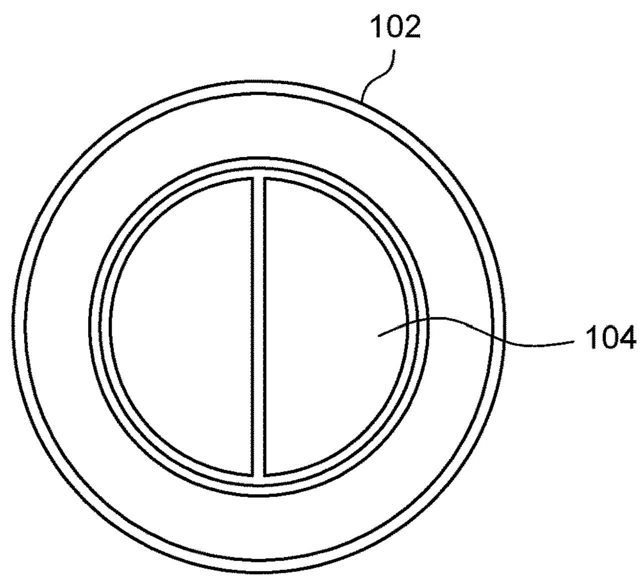
FIG. 6 is a top view of a hybrid substrate carrier having the carrier plate mounted on the carrier ring in accordance with at least some embodiments of the present disclosure.

FIG. 6 is a top view of a hybrid substrate carrier (e.g., substrate carrier 100) having a carrier plate (e.g., carrier plate 104) mounted on a carrier ring (e.g., carrier ring 102) in accordance with at least some embodiments of the present disclosure. As shown in FIG. 6, the outer diameter of the carrier plate 104 is smaller than the inner diameter of the interface between the upper surface 110 of the carrier ring 102 and the inner ledge 108 of the carrier ring 102.

Figure 7:
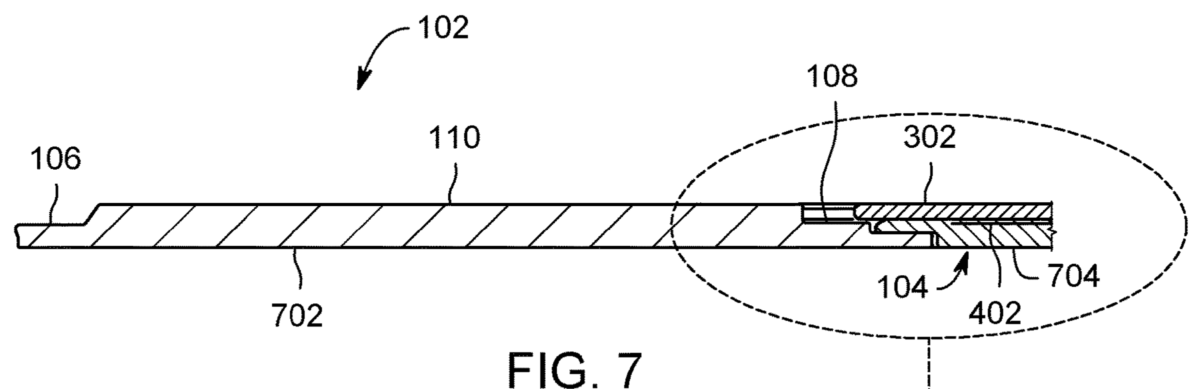
FIG. 7 is a cross-sectional side view of a portion of a hybrid substrate carrier in accordance with at least some embodiments of the present disclosure.

FIG. 7 is a cross-sectional side view of a portion of a hybrid substrate carrier in accordance with at least some embodiments of the present disclosure. As shown in FIG. 7, in some embodiments, the carrier ring 102 includes a lower surface 702 that is parallel to the upper surface 110 such that the overall profile of the carrier ring 102 is substantially flat, or planar (excluding the outer and inner ledges 106, 108). In some embodiments, the substantially planar lower surface 702 extends from the outer diameter to the inner diameter of the carrier ring 102 such that the outer and inner ledges 106, 108 are defined by reduced thickness of the carrier ring 102 such that upper surfaces of the outer and inner ledges 106, 108 are not coplanar with the upper surface 110.

Figure 8:
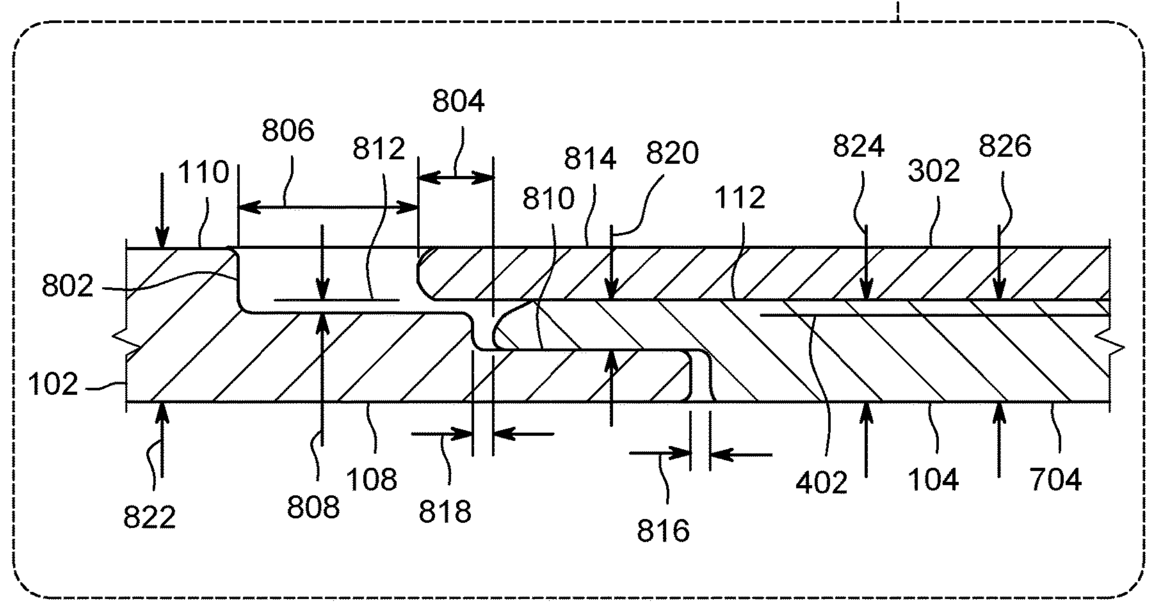
FIG. 8 is detailed a cross-sectional side view of a portion of the hybrid substrate carrier of FIG. 7 in accordance with at least some embodiments of the present disclosure.

FIG. 8 is detailed a cross-sectional side view of a portion of the hybrid substrate carrier of FIG. 7 in accordance with at least some embodiments of the present disclosure. As shown more clearly in FIG. 8, the carrier ring 102 is configured to support the carrier plate 104 on the inner ledge 108 of the carrier ring 102. In some embodiments, a lower surface 704 of the carrier plate 104 may be substantially coplanar with the lower surface 702 of the carrier ring 102. In some embodiments, the inner ledge 108 has a thickness such that an upper surface of a substrate (e.g., substrate 302) disposed on the carrier plate (such as a standard wafer, e.g., a 200 mm wafer) is coplanar or substantially coplanar with the upper surface 110. For example, a thickness 822 of the carrier ring 102 is greater than a thickness 824 of the carrier plate 104. In some embodiments, the thickness 822 is greater than the thickness 824 by an amount substantially equal to a thickness of a substrate 302 to be supported, such that a combined thickness 826 of the carrier plate 104 and the substrate 302 is substantially equal to the thickness 822 of the carrier ring 102.

In some embodiments, the inner edge of the inner ledge 108 of the carrier ring 102 (e.g., sidewall 802 at the interface between upper surface 110 and the inner ledge 108) has a diameter that is greater than the diameter of the substrate disposed on the carrier plate 104. For example, the upper surface of the carrier plate 104, the inner ledge 108, and the sidewall 802 define a pocket in which the substrate may be disposed during use. In embodiments where the carrier plate 104 is designed to support a 200 mm wafer, the carrier plate 104 can have a diameter that is slightly less than the substrate to provide an overhang 804. In some embodiments, the overhang 804 may be about 1 mm (e.g., the carrier plate 104 may have a diameter of about 198 mm). The sidewall 802 may be disposed along a diameter greater than that of the substrate to be supported to define a radial gap 806 between the sidewall 802 and the edge of the substrate. In some embodiments, the radial gap 806 may be about 2.5 mm.

The support surface 112 of the carrier plate 104 is disposed above the inner ledge 108 to define a gap 808 between the plane of the support surface (e.g., and the overhanging bottom surface of the substrate when present) and the plane of the upper surface of the inner ledge 108.

In some embodiments, the inner ledge 108 may be stepped, for example, having an inner portion 810 having a lesser thickness than an outer portion 812 of the inner ledge 108. In such embodiments, the carrier plate 104 may include a corresponding radially extending protrusion 814 configured to rest on the inner portion 810. In such embodiments, the carrier plate 104 has a lower portion having a diameter less than the central opening (e.g., 502 in FIG. 5) such that the carrier plate 104 sits within the central opening and the radially extending protrusion 814 rests upon the inner portion 810 of the inner ledge 108. A gap 816 is disposed between the sidewall of the carrier plate 104 below the radially extending protrusion 814 and the sidewall of the inner ledge 108 adjacent the central opening 502. In some embodiments, the outer portion 812 of the inner ledge 108 has a diameter greater than the radially extending protrusion 814 to define a gap 818 between the outermost diameter of the radially extending protrusion 814 and the step of the inner ledge 108. In some embodiments, the radially extending protrusion 814 has a thickness 820 that is greater than the reduction in thickness of the inner ledge 108 at the step, such that the plane of the support surface 112 is elevated relative to the upper surface of the outer portion 812 of the inner ledge 108 to provide the gap 808 discussed above.

While the foregoing is directed to embodiments of the present disclosure, other and further embodiments of the disclosure may be devised without departing from the basic scope thereof.

The invention claimed is:

1. A substrate carrier, comprising:

a carrier ring having an inner ledge adjacent a central opening of the carrier ring; and a carrier plate having a diameter greater than central opening and configured to rest upon the inner ledge, wherein the carrier plate includes an electrode disposed beneath a support surface to electrostatically clamp a substrate to the support surface of the carrier plate, wherein the outer diameter of the carrier plate is smaller than the inner diameter of an interface between an upper surface of the carrier ring and the inner ledge of the carrier ring.

2. The substrate carrier of claim 1, further comprising:

an outer ledge disposed along the outer peripheral edge of the carrier ring.

3. The substrate carrier of claim 1, further comprising:

an upper surface of the carrier ring disposed radially outward of the inner ledge, wherein the upper surface of the carrier ring is raised above an upper surface of the inner ledge.

4. The substrate carrier of claim 3, wherein the upper surface is substantially planar.

5. The substrate carrier of claim 1, wherein the carrier ring is fabricated from quartz.

6. The substrate carrier of claim 1, wherein the carrier ring and the carrier plate are not coupled together.

7. A substrate carrier, comprising:

a carrier ring having an inner ledge adjacent a central opening of the carrier ring; and a carrier plate having a diameter greater than central opening and configured to rest upon the inner ledge, wherein the carrier plate includes an electrode disposed beneath a support surface to electrostatically clamp a substrate to the support surface of the carrier plate, wherein the carrier ring is configured to be handled by 300 mm substrate handling equipment and the carrier plate is configured to support a substrate having a diameter less than 300 mm radially inward of an upper surface of the carrier ring.

8. The substrate carrier of claim 7, wherein the carrier plate is configured to support a substrate having a diameter of about 200 mm.

9. The substrate carrier of claim 1, wherein the carrier plate is made of a highly thermally conductive material.

10. The substrate carrier of claim 9, wherein the highly thermally conductive material is aluminum nitride or silicon carbide.

11. The substrate carrier of claim 1, wherein the electrode comprises a first electrode and a second electrode.

12. The substrate carrier of claim 11, wherein the first and second electrodes are half-moon, or semi-circular, electrodes.

13. The substrate carrier of claim 1, wherein the carrier ring includes a lower surface that is parallel to an upper surface of the carrier ring such that the carrier ring is substantially flat.

14. The substrate carrier of claim 13, further comprising an outer ledge disposed along the outer peripheral edge of the carrier ring, wherein the lower surface extends from the outer diameter to the inner diameter of the carrier ring such that the outer and inner ledges are defined by a reduced thickness of the carrier ring and such that upper surfaces of the outer and inner ledges are not coplanar with the upper surface.

15. The substrate carrier of claim 1, wherein a thickness of the carrier plate is less than a thickness of the carrier ring.

16. The substrate carrier of claim 15, wherein the thickness of the carrier ring is greater than the thickness of the carrier plate by an amount substantially equal to a thickness of a substrate to be supported, such that a combined thickness of the carrier plate and the substrate to be supported is substantially equal to the thickness of the carrier ring.

17. A substrate carrier, comprising:

a carrier ring having an inner ledge adjacent a central opening of the carrier ring, an outer ledge, and a substantially planar upper surface disposed between the inner and outer ledges; and a carrier plate having a diameter greater than central opening and configured to rest upon the inner ledge, wherein the carrier plate includes an electrode to electrostatically clamp a substrate to the carrier plate;

wherein a lower surface of the carrier plate and a lower surface of the carrier ring are substantially coplanar when the carrier plate is disposed on the inner ledge; and wherein the carrier plate has a thickness less than a thickness of the carrier ring.

18. The substrate carrier of claim 17, wherein the carrier plate has a diameter less than 200 mm, and wherein a sidewall of the carrier ring at the interface of the upper surface and the inner ledge is disposed along a diameter that is greater than 200 mm.

19. A substrate carrier, comprising:

a carrier ring having an inner ledge adjacent a central opening of the carrier ring, an outer ledge, a substantially planar upper surface disposed between the inner and outer ledges, and a substantially planar lower surface opposite the upper surface, wherein the inner ledge is stepped and has an inner portion having a lesser thickness than an outer portion of the inner ledge; and a carrier plate having a diameter greater than central opening and configured to rest upon the inner ledge, wherein the carrier plate includes a lower portion having a diameter less than the central opening and radially extending protrusion configured to rest on the inner portion of the inner ledge of the carrier ring such that the lower portion sits within the central opening, and wherein the carrier plate includes an electrode to electrostatically clamp a substrate to the carrier plate;

wherein a lower surface of the carrier plate and a lower surface of the carrier ring are substantially coplanar when the carrier plate is disposed on the inner ledge; and wherein the carrier plate has a thickness less than a thickness of the carrier ring.

* * * * *